(12) United States Patent
Koeppel et al.

(10) Patent No.: US 10,648,938 B2
(45) Date of Patent: May 12, 2020

(54) METHOD AND SYSTEM FOR DETERMINING OPTIMUM PARAMETERS WITH RESPECT TO ELECTROMAGNETIC BEHAVIOR OF A SURFACE

(71) Applicant: Rohde & Schwarz GmbH & Co. KG, Munich (DE)

(72) Inventors: Tobias Koeppel, Munich (DE); Frank Gumbmann, Nuremberg (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/169,553

(22) Filed: Oct. 24, 2018

(65) Prior Publication Data

US 2020/0072775 A1    Mar. 5, 2020

Related U.S. Application Data

(63) Continuation-in-part of application No. 16/119,192, filed on Aug. 31, 2018.

(51) Int. Cl.
 *G01N 27/02*  (2006.01)
 *G01R 31/62*  (2020.01)

(52) U.S. Cl.
 CPC ......... *G01N 27/023* (2013.01); *G01N 27/028* (2013.01); *G01R 31/62* (2020.01)

(58) Field of Classification Search
 CPC ........... G01N 27/048; G01N 2033/245; G01N 27/121; G01N 27/223; G01N 33/246
 USPC .... 324/71.1, 61, 65, 75, 689, 694, 347, 658, 324/686, 688, 690
 See application file for complete search history.

(56) References Cited

U.S. PATENT DOCUMENTS

| | | | |
|---|---|---|---|
| 3,694,742 A | | 9/1972 | Bergmanis et al. |
| 4,929,904 A | * | 5/1990 | Bohman ............... A01D 89/006 324/694 |
| 2003/0118832 A1 | * | 6/2003 | Skaling ................ G01N 33/246 428/412 |
| 2009/0205363 A1 | * | 8/2009 | de Strulle ............. B08B 7/0014 62/533 |
| 2017/0069696 A1 | * | 3/2017 | Kondo ................ H01L 27/3276 |
| 2017/0077190 A1 | * | 3/2017 | Hashimoto ............... G09F 9/30 |
| 2017/0098398 A1 | * | 4/2017 | Amatsuchi ............. G09G 3/006 |

\* cited by examiner

*Primary Examiner* — Giovanni Astacio-Oquendo
(74) *Attorney, Agent, or Firm* — Ditthavong & Steiner P.C.

(57) ABSTRACT

A method for determining optimum parameters with respect to transmission and/or reflection of a surface is provided. The method comprises the steps of applying the surface to a transformer material in order to form a sample arrangement, and obtaining at least one measurement parameter of electromagnetic relevance with respect to the surface of the sample arrangement with the aid of an electromagnetic excitation signal generated by a measurement equipment. In this context, the transformer material comprises at least two dimensions for varying a contribution of at least one sample parameter of electromagnetic relevance over the surface.

19 Claims, 5 Drawing Sheets

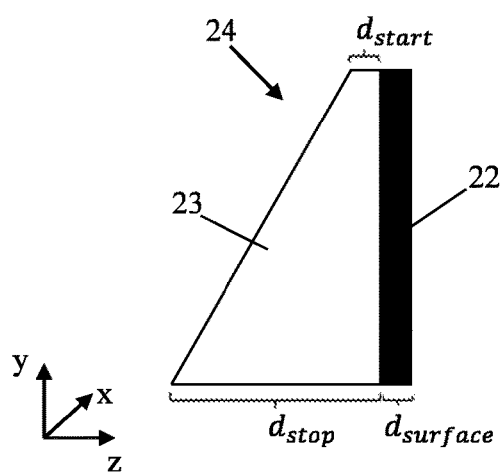
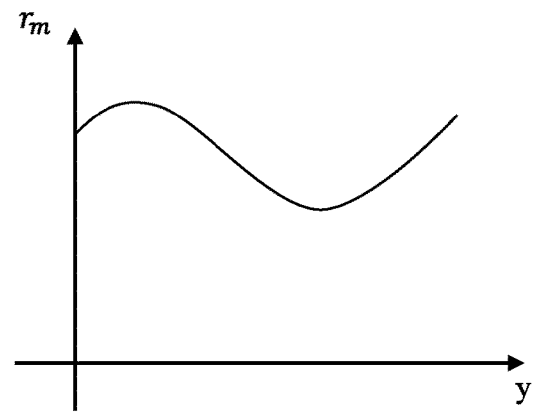
Fig. 7a
Fig. 7b
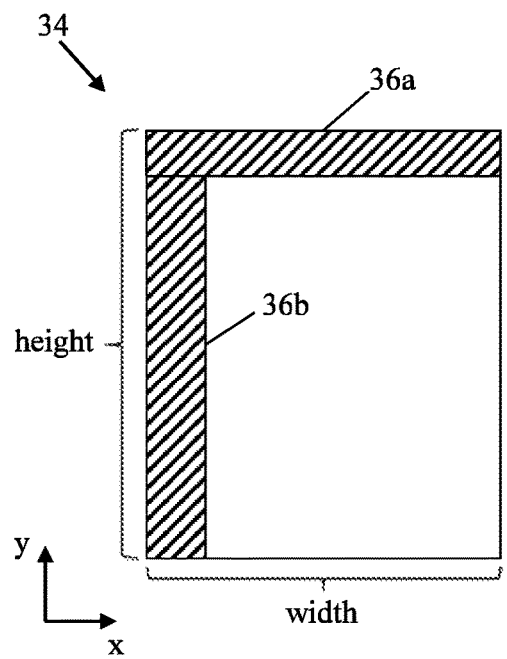
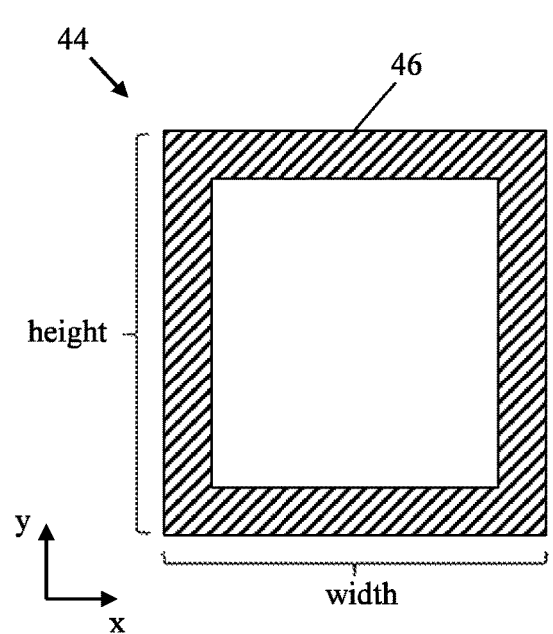
Fig. 8a
Fig. 8b

METHOD AND SYSTEM FOR DETERMINING OPTIMUM PARAMETERS WITH RESPECT TO ELECTROMAGNETIC BEHAVIOR OF A SURFACE

RELATED APPLICATION

The present application is a continuation-in-part of U.S. application Ser. No. 16/119,192, filed Aug. 31, 2018, which is incorporated herein by reference in its entirety.

TECHNICAL FIELD

The invention relates to a method and a system for determining optimum parameters with respect to electromagnetic behavior, especially transmission and/or reflection, of a surface.

BACKGROUND ART

Generally, in times of an increasing number of applications providing radar sensing capabilities such as autonomous vehicles, there is a growing need of a method and a system for determining optimum parameters with respect to electromagnetic behavior of a surface in connection with materials used in this radar context especially to verify correct functioning of said applications in a highly accurate and efficient manner.

U.S. Pat. No. 3,694,742 discloses a device for measuring permittivity, and thus a parameter concerning transmission and reflection, of materials on the basis of at least two different measured capacitance values of a capacitor connected to the material being tested and to a measuring oscillator the output of which is coupled to the input of a frequency meter in the form of a series combination of a switch and a pulse counter with a resetting unit, said capacitor being formed by at least two main electrodes permanently connected to the input of said measuring oscillator, and one additional electrode which is alternately connected by a changeover switch to one of said main electrodes in the course of measurement, while said resetting unit is connected to said pulse counter in the form of a reversible counter by an on-off switch actuated synchronously with said switch of the measured capacitor electrodes, the direction of counting of said reversible counter being determined by the position of said changeover switch of the measured capacitor electrodes. As it can be seen, due to the usage of said capacitor exclusively allowing for permittivity measurements with respect to materials of a higher thickness, the use of said device in the context of optimum parameters determination with respect to transmission or reflection of a surface disadvantageously leads to no useful result or a limited accuracy, and thus also to a reduced efficiency.

Accordingly, there is a need to provide a method and a system for determining optimum parameters with respect to electromagnetic behavior, especially transmission and/or reflection, of a surface, each of which ensures both a high accuracy and an increased efficiency.

SUMMARY OF THE INVENTION

According to a first aspect of the invention, a method for determining optimum parameters with respect to transmission and/or reflection of a surface is provided. The method comprises the steps of applying the surface to a transformer material in order to form a sample arrangement, and obtaining at least one measurement parameter of electromagnetic relevance with respect to the surface of the sample arrangement with the aid of an electromagnetic excitation signal generated by a measurement equipment. In this context, the transformer material comprises at least two dimensions for varying a contribution of at least one sample parameter of electromagnetic relevance over the surface. Advantageously, optimum parameters with respect to electromagnetic behavior, especially transmission and/or reflection, of a surface can be determined, thereby especially ensuring both a high accuracy and an increased efficiency.

According to a first preferred implementation form of the first aspect of the invention, the transformer material comprises multiple layers. Additionally or alternatively, the transformer material is a test plate. Further additionally or alternatively, the measurement equipment comprises a network analyzer, preferably a vector network analyser. In further addition to this or as a further alternative, the measurement equipment comprises an electromagnetic imaging device, preferably an electromagnetic imaging device being capable of at least two dimensional imaging. Advantageously, for instance, accuracy can further be increased.

According to a second preferred implementation form of the first aspect of the invention, the method further comprises the step of processing the at least one measurement parameter of electromagnetic relevance into an image-like measurement result. Advantageously, especially due to visualization, efficiency can further be increased.

According to a further preferred implementation form of the first aspect of the invention, the image-like measurement result visually represents an optimal location of the at least one sample parameter of electromagnetic relevance on the image-like measurement result and/or at least one suboptimal location across the surface. Advantageously, for example, efficiency can further be increased.

According to a further preferred implementation form of the first aspect of the invention, the method further comprises the step of presenting the image-like measurement result across the surface. Advantageously, the image-like measurement result can be visualized in a particularly efficient manner.

According to a further preferred implementation form of the first aspect of the invention, the method further comprises the step of presenting the optimal location in the image-like measurement result. Advantageously, the image-like measurement result can be visualized in a particularly accurate manner.

According to a further preferred implementation form of the first aspect of the invention, the method further comprises the step of varying the at least one sample parameter of electromagnetic relevance in each of the at least two dimensions of the transformer material. Advantageously, optimum parameters can be determined in a particularly accurate and efficient manner.

According to a further preferred implementation form of the first aspect of the invention, the method further comprises the step of setting the electromagnetic excitation signal to at least one transmission frequency, wherein the at least one transmission frequency is suited to transmit through the transformer material. Advantageously, a low bandwidth is sufficient, which leads to reduced costs and an increased efficiency.

According to a further preferred implementation form of the first aspect of the invention, the method further comprises the step of varying the thickness of layers of potential electromagnetic relevance, preferably of electromagnetic relevance, of the sample arrangement. In addition to this or as an alternative, the method further comprises the step of varying the thickness of the transformer material. Advantageously, complexity can be reduced, thereby increasing efficiency.

According to a further preferred implementation form of the first aspect of the invention, the sample arrangement comprises wire lines. In this context, the method further comprises the step of varying the density of the wire lines across the surface. Advantageously, for instance, simplicity can be increased, thereby reducing costs and increasing efficiency.

According to a further preferred implementation form of the first aspect of the invention, the at least one measurement parameter of electromagnetic relevance comprises with respect to the surface of the sample arrangement, a measured impedance and/or a measured reflection coefficient. Additionally or alternatively, the at least one measurement parameter of electromagnetic relevance comprises with respect to the surface of the sample arrangement, a measured reflection coefficient. Advantageously, the at least one measurement parameter of electromagnetic relevance can be obtained in an accurate and efficient manner.

According to a further preferred implementation form of the first aspect of the invention, the method further comprises the step of correcting attenuation and/or phase with respect to free space propagation from the measurement equipment to the sample arrangement with the aid of a reference arrangement. Advantageously, accuracy can further be increased.

According to a further preferred implementation form of the first aspect of the invention, the reference arrangement comprises at least one metal stripe. In addition to this or as an alternative, the reference arrangement comprises at least one metal plate. Advantageously, complexity can be reduced, thereby reducing costs and additionally increasing efficiency.

According to a further preferred implementation form of the first aspect of the invention, the method further comprises the step of correcting at least one tilt angle of the sample arrangement with respect to the measurement equipment with the aid of the phase response of the reference arrangement over the sample arrangement area. Advantageously, accuracy can further be increased, thereby increasing also efficiency.

According to a further preferred implementation form of the first aspect of the invention, the at least one sample parameter of electromagnetic relevance comprises the permittivity of the transformer material $\varepsilon_{transformer}$. In this context, the method further comprises the step of calculating the phase constant of the transformer material $\beta_{transformer}$ with the aid of the following equation:

$$\beta_{transformer} = \frac{2\pi}{\lambda}\sqrt{\varepsilon_{transformer}},$$

wherein $\lambda$ is the wavelength of the electromagnetic excitation signal.

According to a further preferred implementation form of the first aspect of the invention, the at least one sample parameter of electromagnetic relevance comprises the permittivity of the transformer material $\varepsilon_{transformer}$. In this context, the method further comprises the step of calculating the impedance of the transformer material $Z_{transformer}$ with the aid of the following equation:

$$Z_{transformer} = \frac{z_0}{\sqrt{\varepsilon_{transformer}}},$$

wherein $Z_0$ is the impedance of free space.

According to a further preferred implementation form of the first aspect of the invention, the at least one sample parameter of electromagnetic relevance further comprises the thickness of the transformer material $d_{transformer}$, the impedance of the transformer material $Z_{transformer}$, and the transformed free space impedance over the transformer material $Z_{trans,transformer}$. In this context, the method further comprises the step of calculating the impedance of the transformer material with the aid of the following equation:

$$Z_{transformer} = \frac{z_0}{\sqrt{\varepsilon_{transformer}}},$$

wherein $Z_0$ is the impedance of free space. In addition to this, the method further comprises the step of calculating the transformed free space impedance over the transformer material with the aid of the following equation:

$$Z_{trans,transformer} = \frac{z_0 + jz_{transformer}\tan(\beta_{transformer}d_{transformer})}{z_{transformer} + jz_0\tan(\beta_{transformer}d_{transformer})},$$

wherein j is the imaginary number.

According to a further preferred implementation form of the first aspect of the invention, the at least one measurement parameter of electromagnetic relevance comprises with respect to the surface of the sample arrangement, a measured reflection coefficient $r_m$. In this context, the method further comprises the step of calculating the corresponding impedance $Z_m$ by solving the following equation for $Z_m$:

$$r_m = \frac{Z_m - Z_0}{Z_m + Z_0},$$

wherein $Z_0$ is the impedance of free space.

According to a further preferred implementation form of the first aspect of the invention, the method further comprises the step of calculating the permittivity of the surface $\varepsilon_{surface}$ by solving the following equation for $\varepsilon_{surface}$:

$$Z_m = \frac{z_{trans,transformer} + j\frac{z_0}{\sqrt{\varepsilon_{surface}}}\tan\left(\frac{2\pi}{\lambda}d_{surface}\sqrt{\varepsilon_{surface}}\right)}{\frac{z_0}{\sqrt{\varepsilon_{surface}}} + jZ_{trans,transformer}\tan\left(\frac{2\pi}{\lambda}d_{surface}\sqrt{\varepsilon_{surface}}\right)},$$

wherein j is the imaginary number, wherein $Z_0$ is the impedance of free space, wherein $\lambda$ is the wavelength of the electromagnetic excitation signal, wherein $d_{surface}$ is the thickness of the surface, and wherein $Z_{trans,transformer}$ is the transformed free space impedance over the transformer material being defined as $$Z_{trans,transformer} = \frac{Z_0 + jZ_{transformer}\tan(\beta_{transformer}d_{transformer})}{Z_{transformer} + jZ_0\tan(\beta_{transformer}d_{transformer})},$$

wherein $Z_{transformer}$ is the impedance of the transformer material being defined as wherein $$Z_{transformer} = \frac{Z_0}{\sqrt{\varepsilon_{transformer}}},$$

$\varepsilon_{transformer}$ is the permittivity of the transformer material, wherein $\beta_{transformer}$ is the phase constant of the transformer material being defined as $$\beta_{transformer} = \frac{2\pi}{\lambda}\sqrt{\varepsilon_{transformer}},$$

and
wherein $d_{transformer}$ is the thickness of the transformer material. Advantageously, optimum parameters with respect to electromagnetic behavior, especially transmission and/or reflection, of a surface can be determined in a particularly accurate and efficient manner.

According to a further preferred implementation form of the first aspect of the invention, the measurement of a test plate not only gives the optimum frequency matching, but also a tolerance analysis of the varied parameter at the same time. Around the area of optimum frequency matching, one can observe the degradation depending on the changes in the parameters chosen.

According to a second aspect of the invention, a system for determining optimum parameters with respect to transmission and/or reflection of a surface is provided. The system comprises an applicator configured to apply the surface to a transformer material in order to form a sample arrangement, and a measurement equipment configured to obtain at least one measurement parameter of electromagnetic relevance with respect to the surface of the sample arrangement with the aid of an electromagnetic excitation signal. In this context, the transformer material comprises at least two dimensions for varying a contribution of at least one sample parameter of electromagnetic relevance over the surface. Advantageously, optimum parameters with respect to electromagnetic behavior, especially transmission and/or reflection, of a surface can be determined, thereby especially ensuring both a high accuracy and an increased efficiency.

BRIEF DESCRIPTION OF THE DRAWINGS

Exemplary embodiments of the invention are now further explained with respect to the drawings by way of example only, and not for limitation. In the drawings:

FIG. 7a shows an exemplary side view of a sample arrangement with varying thickness of the transformer material;

FIG. 7b shows an exemplary diagram with respect to the measured reflection coefficient in connection with a varying thickness of the transformer material of the sample arrangement;

FIG. 8a shows an exemplary front view of a sample arrangement comprising a reference arrangement; and FIG. 8b shows a further exemplary front view of a sample arrangement comprising a reference arrangement in the form of a frame.

DETAILED DESCRIPTION OF THE PREFERRED EMBODIMENTS

Figure 1:
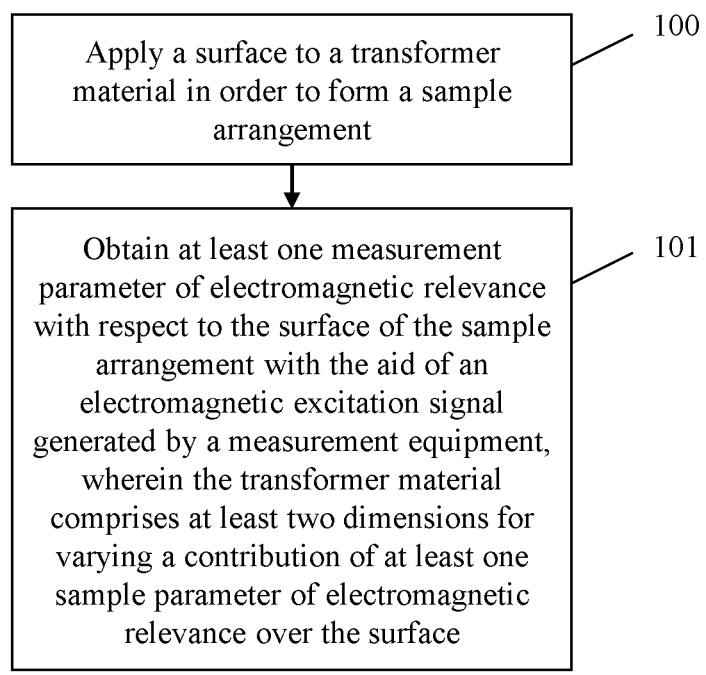
FIG. 1 shows a flow chart of an exemplary embodiment of the first aspect of the invention.

Firstly, FIG. 1 shows a flow chart of an exemplary embodiment of the inventive method for determining optimum parameters with respect to transmission and/or reflection of a surface. In a first step 100, the surface is applied to a transformer material in order to form a sample arrangement. Then, in a second step 101, at least one measurement parameter of electromagnetic relevance is obtained with respect to the surface of the sample arrangement with the aid of an electromagnetic excitation signal generated by a measurement equipment. In this context, the transformer material comprises at least two dimensions for varying a contribution of at least one sample parameter of electromagnetic relevance over the surface.

Figure 2:
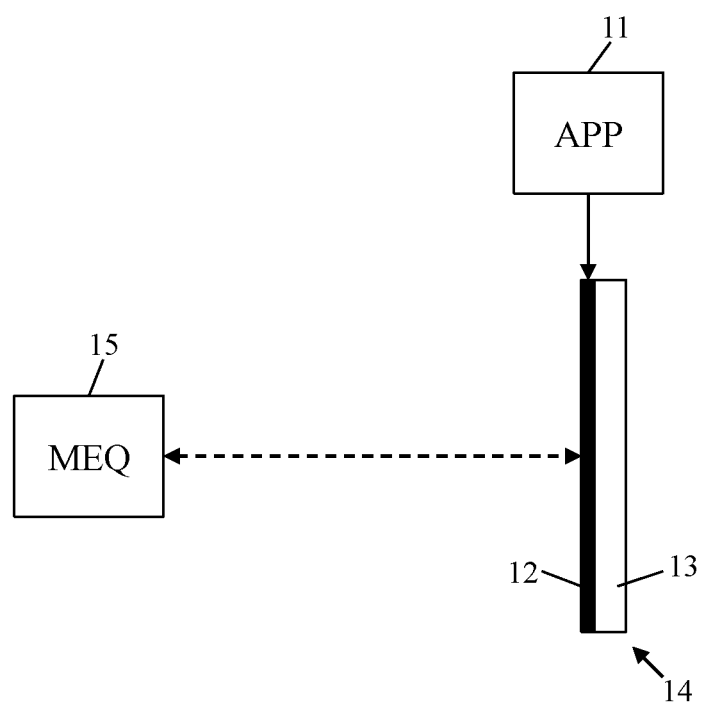
FIG. 2 shows an exemplary embodiment of the of the second aspect of the invention.

Furthermore, an exemplary embodiment of an inventive system for determining optimum parameters with respect to transmission and/or reflection of a surface is illustrated by FIG. 2. The system comprises an applicator 11 applying the surface 12 to a transformer material 13 in order to form a sample arrangement 14, and a measurement equipment 15 obtaining at least one measurement parameter of electromagnetic relevance with respect to the surface 12 of the sample arrangement 14 with the aid of an electromagnetic excitation signal. In this context, the transformer material comprises at least two dimensions for varying a contribution of at least one sample parameter of electromagnetic relevance over the surface 12.

With respect to the surface 12, it is noted that the surface 12 may preferably comprise a paint, a coating, a primer, or any combination thereof.

With respect to the transformer material 13, it is further noted that the transformer material 13 may preferably comprise multiple layers. Additionally or alternatively, the transformer material 13 may especially be a test plate.

With respect to the measurement equipment 15, it should be mentioned that the measurement equipment 15 may especially comprise a network analyzer, preferably a vector network analyser. In addition to this or as an alternative, the measurement equipment 15 may especially comprise an electromagnetic imaging device, preferably an electromagnetic imaging device being capable of at least two dimensional imaging.

It might be particularly advantageous if the measurement equipment 15 processes the at least one measurement parameter of electromagnetic relevance into an image-like measurement result.

With respect to said image-like measurement result, it is noted that the image-like measurement result may visually represent an optimal location of the at least one sample parameter of electromagnetic relevance on the image-like measurement result and/or at least one suboptimal location across the surface 12.

Furthermore, the measurement equipment 15 may advantageously present the image-like measurement result across the surface 12.

Further advantageously, the measurement equipment 15 may especially present the optimal location in the image-like measurement result.

Moreover, it might be particularly advantageous if the applicator 11 varies the at least one sample parameter of electromagnetic relevance in each of the at least two dimensions of the transformer material 13. In addition to this or as an alternative, the measurement equipment 15 may vary the at least one sample parameter of electromagnetic relevance in each of the at least two dimensions of the transformer material 13. Further additionally or further alternatively, the at least one sample parameter of electromagnetic relevance may especially be varied in each of the at least two dimensions of the transformer material 13 especially when the transformer material 13 is produced.

Furthermore, the measurement equipment 15 may preferably set the electromagnetic excitation signal to at least one transmission frequency, wherein the at least one transmission frequency is suited to transmit through the transformer material 13.

With respect to the sample arrangement 14, it is noted that the thickness of layers of potential electromagnetic relevance, preferably of electromagnetic relevance, of the sample arrangement may especially be varied. In addition to this or as an alternative, the thickness of the transformer material 13 may be varied. In this context, the thickness of the transformer material 13 may especially be varied when the transformer material 13 is produced.

With respect to the sample arrangement 14, it is noted that the sample arrangement 14 may especially comprise wire lines, wherein the density of the wire lines may preferably be varied across the surface 12. Additionally or alternatively, the surface 12 may especially comprise wire lines, wherein the density of the wire lines may preferably be varied across the surface 12. Further additionally or alternatively, the transformer material 13 may especially comprise wire lines, wherein the density of the wire lines may preferably be varied across the surface 12.

In this context, said density of the wire lines may preferably be varied when the sample arrangement 14 is formed. In addition to this or as an alternative, the density of the wire lines may especially may varied when the surface 12 is applied and/or when the transformer material 13 is produced.

With respect to the at least one measurement parameter of electromagnetic relevance, it is noted that the at least one measurement parameter of electromagnetic relevance comprises with respect to the surface 12 of the sample arrangement 14, a measured impedance. Additionally or alternatively, the at least one measurement parameter of electromagnetic relevance comprises with respect to the surface 12 of the sample arrangement 14, a measured reflection coefficient.

Furthermore, the measurement equipment 15 may preferably correct attenuation and/or phase with respect to free space propagation from the measurement equipment 15 to the sample arrangement 14 with the aid of a reference arrangement.

In this context, said reference arrangement may especially comprise at least one metal stripe. In addition to this or as an alternative, the reference arrangement may especially comprise at least one metal plate.

It might be particularly advantageous if the measurement equipment 15 corrects at least one tilt angle of the sample arrangement 14 with respect to the measurement equipment 15 with the aid of the phase response of the reference arrangement over the sample arrangement area.

Furthermore, the at least one sample parameter of electromagnetic relevance may especially comprise the permittivity of the transformer material 13 denoted as $\varepsilon_{transformer}$. In this context, the measurement equipment 15 may preferably calculate the phase constant of the transformer material $\beta_{transformer}$ with the aid of the following equation:

$$\beta_{transformer} = \frac{2\pi}{\lambda}\sqrt{\varepsilon_{transformer}}, \quad (1)$$

wherein $\lambda$ is the wavelength of the electromagnetic excitation signal.

Additionally or alternatively, the measurement equipment 15 may preferably calculate the impedance of the transformer material $Z_{transformer}$ with the aid of the following equation:

$$Z_{transformer} = \frac{Z_0}{\sqrt{\varepsilon_{transformer}}}, \quad (2)$$

wherein $Z_0$ is the impedance of free space.

Moreover, the at least one sample parameter of electromagnetic relevance may further comprise the thickness of the transformer material 13 denoted as $d_{transformer}$, the above-mentioned impedance of the transformer material $Z_{transformer}$, and the transformed free space impedance over the transformer material denoted as $Z_{trans,transformer}$. In this context, the measurement equipment 15 may preferably calculate the transformed free space impedance over the transformer material with the aid of the following equation:

$$Z_{trans,transformer} = \frac{Z_0 + jZ_{transformer}\tan(\beta_{transformer}d_{transformer})}{Z_{transformer} + jZ_0\tan(\beta_{transformer}d_{transformer})}, \quad (3)$$

wherein j is the imaginary number.

In addition to this or as an alternative, the at least one measurement parameter of electromagnetic relevance may especially comprise with respect to the surface 12 of the sample arrangement 14, a measured reflection coefficient denoted as $r_m$. In this context, the measurement equipment 15 may preferably calculate the corresponding impedance $Z_m$ by solving the following equation for $Z_m$:

$$r_m = \frac{Z_m - Z_0}{Z_m + Z_0}. \quad (4)$$

Furthermore, the measurement equipment 15 may preferably calculate the permittivity of the surface 12 denoted as $\varepsilon_{surface}$ by solving the following equation for $\varepsilon_{surface}$ $$Z_m = \frac{z_{trans,transformer} + j\frac{z_0}{\sqrt{\varepsilon_{surface}}}\tan\left(\frac{2\pi}{\lambda}d_{surface}\sqrt{\varepsilon_{surface}}\right)}{\frac{z_0}{\sqrt{\varepsilon_{surface}}} + jZ_{trans,transformer}\tan\left(\frac{2\pi}{\lambda}d_{surface}\sqrt{\varepsilon_{surface}}\right)}, \quad (5)$$

wherein $d_{surface}$ is the thickness of the surface 12.

In this context, it is noted that $$\frac{z_0}{\sqrt{\varepsilon_{surface}}}$$

can be written as $Z_{surface}$ which leads to the following equation:

$$Z_{surface} = \frac{z_0}{\sqrt{\varepsilon_{surface}}}, \quad (6)$$

wherein $Z_{surface}$ is the impedance of the surface 12.

It is further noted that $$\frac{2\pi}{\lambda}\sqrt{\varepsilon_{surface}}$$

might be written as $\beta_{surface}$, which leads to the following equation:

$$\beta_{surface} = \frac{2\pi}{\lambda}\sqrt{\varepsilon_{surface}}, \quad (7)$$

wherein $\beta_{surface}$ is the phase constant of the surface 12.

Figure 3:
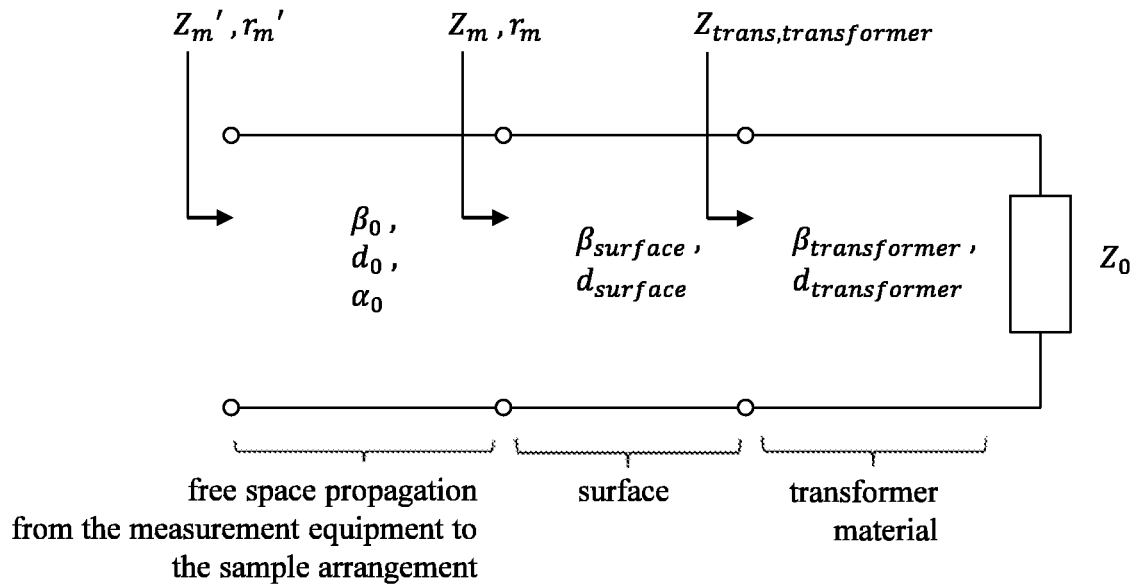
FIG. 3 shows an exemplary embodiment of an equivalent circuit diagram with respect to the sample arrangement.

Now, with respect to FIG. 3, an exemplary embodiment of an equivalent circuit diagram with respect to the sample arrangement 14, especially an extended model of said equivalent circuit diagram, is shown.

In this context, account is taken of the fact that the beam transmitted by the measurement equipment 15 has to propagate through free space before arriving at the sample arrangement 14 for distance $d_0$. Furthermore, at the sample arrangement 14, the beam has especially been attenuated mainly by free space path loss $\alpha_0$. In addition to this, the beam has especially experienced a change in phase due to the distance travelled, which can be expressed by the phase constant $\beta_0$ of the free space, wherein for $\beta_0$ the following equation applies:

$$\beta_0 = \frac{2\pi}{\lambda}. \quad (8)$$

Whereas the most of the parameters shown in FIG. 3 have already been explained above, it is noted that $Z_m'$ represents the unreferenced measured impedance and $r_m'$ represents the unreferenced measured reflection coefficient.

Figure 4:
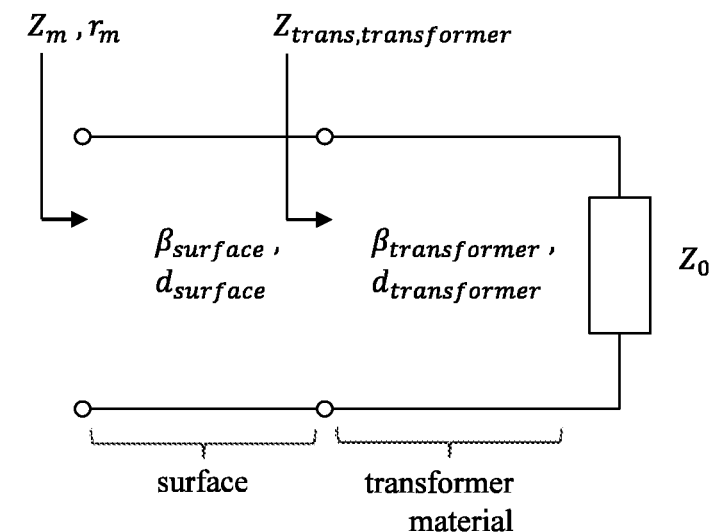
FIG. 4 shows an exemplary embodiment of a simplified equivalent circuit diagram with respect to the sample arrangement.

It is further noted that said extended model can be reduced to the equivalent circuit diagram according to FIG. 4, wherein the parameters with special respect to the free space propagation from the measurement equipment 15 to the sample arrangement 14 have been eliminated.

In this context, both the unknown attenuation and phase are corrected with the aid of the reference arrangement, which has already been mentioned above and will be explained in more detail with the aid of FIG. 8a and FIG. 8b, on the sample arrangement 14.

With respect to each of the equivalent circuit diagram according to FIG. 3 and the equivalent circuit diagram of FIG. 4, it is noted that if some parameters are unknown, said unknown parameters may preferably be estimated.

Figure 5:
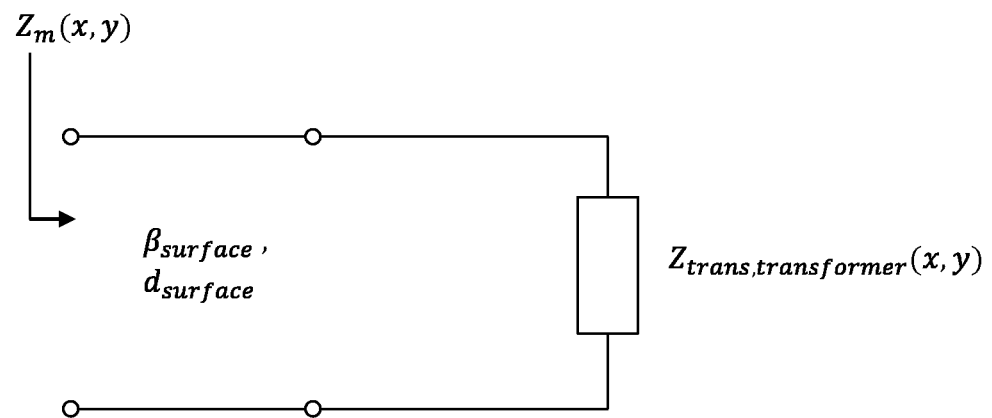
FIG. 5 shows an exemplary embodiment of an equivalent circuit diagram in the context of varying sample parameters of electromagnetic relevance with respect to different dimensions of the transformer material.

In accordance with FIG. 5, a further exemplary embodiment of an equivalent circuit diagram with special respect to the case that the at least one sample parameter of electromagnetic relevance varies in each of the at least two dimensions of the transformer material 13 is shown.

As it can be seen, said variation exemplarily occurs with respect to two dimensions. In other words, said variation exemplarily occurs in the x-direction and the y-direction. Accordingly, the respective measured impedance is position-dependent, which leads to the position-dependent measured impedance denoted as $Z_m(x,y)$. Preferably, location $(x,y)$ represents one pixel in the corresponding reflection image or in the image-like measurement result, respectively.

Alternatively, the variation may especially occur in three dimensions, which would lead to a position-dependent measured impedance denoted as $Z_m(x,y,z)$. As a further alternative, the variation may occur in one dimension, which would lead to a position-dependent measured impedance denoted as $Z_m(x)$, $Z_m(y)$, or $Z_m(z)$.

Furthermore, with respect to the corresponding reflection coefficient, especially the position-dependent measured reflection coefficient denoted as $r_m(x,y)$, the following equation applies:

$$r_m(x, y) = \frac{z_m(x, y) - z_0}{z_m(x, y) + z_0}. \quad (9)$$

In this context, it is noted that said equation (9) analogously applies for the alternative cases that the variation occurs in one dimension or in three dimensions.

It is further noted that the permittivity of the surface 12 of the sample arrangement 14 can be recovered on the basis of the position-dependent measured reflection coefficient which is changing over the respective dimensions. In this context, the measurement equipment 15 may especially recover the permittivity of the surface 12 of the sample arrangement on the basis of the position-dependent measured reflection coefficient.

Figure 6:
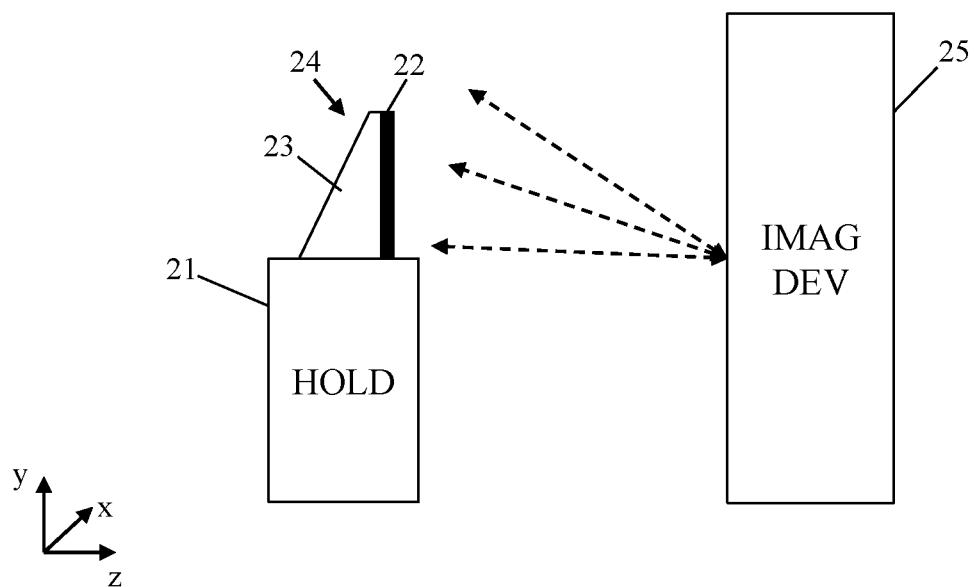
FIG. 6 shows a further exemplary embodiment of the inventive system.

Now, with respect to FIG. 6, a further exemplary embodiment of the inventive system for determining optimum parameters with respect to transmission and/or reflection of a surface is shown. In this exemplary case, the system comprises a holder 21 holding the sample arrangement 24 and measurement equipment especially in the form of an imaging device 25.

In addition to this, the sample arrangement 24 comprises transformer material 23 and a surface 22 applied thereto.

It is noted that with respect to the imaging device 25, the surface 22, the transformer material 23, and the sample arrangement 24, the explanations concerning the measurement equipment 15, the surface 12, the transformer material 13, and the sample arrangement 14 according to FIG. 2 analogously apply.

In addition to this, it is generally noted that even it is not necessary, especially for an easier recovery of the permittivity of the surface of the sample arrangement, the transformer material may preferably be characterized beforehand through a measurement without the surface.

Moreover, with special respect to the sample arrangement 24 according to FIG. 6, said sample arrangement 24 is illustrated in more detail with the aid of FIG. 7a which shows a side view of the sample arrangement 24.

As it can be seen from said FIG. 7a, whereas the surface 22, especially in the form of a surface layer, comprises a constant thickness denoted as $d_{surface}$, the thickness of the transformer material 23, especially in the form of a transformer layer, varies over the y-dimension.

In this exemplary case, the thickness of the transformer material 23 rises, especially linearly, from a first thickness denoted as $d_{start}$ to a second thickness denoted as $d_{stop}$.

In this context, it is noted that the absolute value of the difference of the second thickness, especially the highest thickness, of the transformer material 23 and the first thickness, especially the lowest thickness, of the transformer material 23 should be greater or equal to the half of the wavelength of the electromagnetic excitation signal, which leads to the following equation:

$$|d_{stop} - d_{start}| \geq \frac{\lambda}{2}. \tag{10}$$

With general respect to the transformer material, especially a transformer layer, it should be mentioned that the transformer material transforms the reflection coefficient of the surface especially on a circle in the complex plane. Furthermore, the measurement equipment or the imaging device, respectively, preferably captures this circle through a spatially resolved complex reflection measurement.

In this context, a reference arrangement may be applied to the surface, especially a surface layer or a top layer, in order to especially allow for correct phase measurements. Said reference arrangement preferably comprises a known phase of its reflection coefficient.

In general, it is further noted that the transformer material especially is a transformer layer which changes the electrical behavior of the sample arrangement over space. Advantageously, the transformer material or the material of the transformer layer, respectively, has not to be known.

In addition to this, the transformer material, especially the transformer layer, may preferably be of stepped shape or continuous shape.

Additionally or alternatively, the transformer material, especially the transformer layer, may preferably be implemented in the form of wedges. In further addition to this or as a further alternative, the transformer material, especially the transformer layer, may preferably be implemented in the form of inductive and/or capacitive wire grids.

Furthermore, the transformer material, especially the transformer layer, may preferably be integrated in the sample arrangement or attached to it. As already mentioned above, the transformer material, especially the transformer layer, has to change electrical, especially electromagnetic, properties in at least one dimension. Additionally or alternatively, the transformer material, especially the transformer layer, may preferably comprise more than one layer or may be composed of more than one layer.

In further addition to this or as a further alternative, the transformer material, especially the transformer layer, may preferably comprise more than one element that changes its electrical, especially electromagnetic, properties such as a plastic wedge combined with inductive and/or capacitive grids.

With special respect to the sample arrangement, it is noted that at least one part of the sample arrangement may act as a transformer material, especially as a transformer layer. Furthermore, the above-mentioned reference arrangement may preferably be used on the sample arrangement, which is especially not necessary if the geometry of the sample arrangement is well known.

Now, regarding FIG. 7b, an exemplary diagram of the measured reflection coefficient with respect to the sample arrangement 24 according to FIG. 7a is shown, wherein the thickness of the transformer material 23, especially the thickness of the transformer layer, varies over the y-dimension, which leads to a dependence of the measured reflection coefficient $r_m$ from the respective y-position. In other words, the diagram of FIG. 7b especially illustrates the position-dependent measured reflection coefficient $r_m(y)$.

As it can be seen from FIG. 7b, in this exemplary case, the measured reflection coefficient, especially the position-dependent measured reflection coefficient, oscillates along the y-axis.

Moreover, FIG. 8a depicts an exemplary front view of a sample arrangement 34 comprising a first exemplary embodiment of a reference arrangement. In this context, said first exemplary embodiment of the reference arrangement comprises a first metal stripe 36a and a second metal stripe 36b. In this exemplary case, said two metal stripes 36a, 36b are preferably arranged in a L-shape.

Finally, FIG. 8b illustrates a further exemplary front view of a sample arrangement 44 comprising a second exemplary embodiment of a reference arrangement. Said second exemplary embodiment of the reference arrangement comprises a frame 46 of metal or of a material with a known phase of its respective reflection coefficient. In this context, said frame 46 is preferably applied or attached to the sample arrangement 44 such as a picture frame.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A method for determining optimum parameters with respect to transmission and/or reflection of a surface, the method comprising the steps of:

applying the surface to a transformer material with an applicator to form a sample arrangement, obtaining at least one measurement parameter of electromagnetic relevance with respect to the surface of the sample arrangement with an electromagnetic excitation signal generated by measurement equipment, wherein the transformer material comprises at least two dimensions for varying a contribution of at least one sample parameter of electromagnetic relevance over the surface, and varying the at least one sample parameter of electromagnetic relevance in each of the at least two dimensions of the transformer material.

2. The method according to claim 1,
wherein the transformer material comprises multiple layers, and/or
wherein the transformer material is a test plate, and/or
wherein the measurement equipment comprises a network analyzer or a vector network analyser, and/or
wherein the measurement equipment comprises an electromagnetic imaging device capable of at least two dimensional imaging.

3. The method according to claim 1,
wherein the image-like measurement result visually represents an optimal location of the at least one sample parameter of electromagnetic relevance on the image-like measurement result and/or at least one suboptimal location across the surface.

4. The method according to claim 3,
wherein the method further comprises the step of presenting the optimal location in the image-like measurement result.

5. The method according to claim 1,
wherein the method further comprises the step of presenting the image-like measurement result across the surface.

6. The method according to claim 1,
wherein the method further comprises the step of setting the electromagnetic excitation signal to at least one transmission frequency, wherein the at least one transmission frequency is suited to transmit through the transformer material.

7. The method according to claim 1,
wherein the method further comprises the step of varying the thickness of layers of potential electromagnetic relevance of the sample arrangement, and/or
wherein the method further comprises the step of varying the thickness of the transformer material.

8. The method according to claim 1,
wherein the sample arrangement comprises wire lines,
wherein the method further comprises the step of varying the density of the wire lines across the surface.

9. The method according to claim 1,
wherein the at least one measurement parameter of electromagnetic relevance comprises with respect to the surface of the sample arrangement, a measured impedance and/or a measured reflection coefficient.

10. The method according to claim 1,
wherein the method further comprises the step of correcting attenuation and/or phase with respect to free space propagation from the measurement equipment to the sample arrangement with the aid of a reference arrangement.

11. The method according to claim 10,
wherein the reference arrangement comprises at least one metal stripe and/or at least one metal plate.

12. The method according to claim 10,
wherein the method further comprises the step of correcting at least one tilt angle of the sample arrangement with respect to the measurement equipment with the phase response of the reference arrangement over the sample arrangement area.

13. The method according to claim 1,
wherein the at least one sample parameter of electromagnetic relevance comprises the permittivity of the transformer material $\varepsilon_{transformer}$,
wherein the method further comprises the step of calculating the phase constant of the transformer material $\beta_{transformer}$ with the aid of the following equation:

$$\beta_{transformer} = \frac{2\pi}{\lambda}\sqrt{\varepsilon_{transformer}},$$

wherein $\lambda$ is the wavelength of the electromagnetic excitation signal.

14. The method according to claim 13,
wherein the at least one sample parameter of electromagnetic relevance further comprises the thickness of the transformer material $d_{transformer}$, the impedance of the transformer material $Z_{transformer}$, and the transformed free space impedance over the transformer material $Z_{transformer}$,
wherein the method further comprises the step of calculating the impedance of the transformer material with the aid of the following equation:

$$Z_{transformer} = \frac{z_0}{\sqrt{\varepsilon_{transformer}}},$$

wherein $Z_0$ is the impedance of free space, and
wherein the method further comprises the step of calculating the transformed free space impedance over the transformer material with the aid of the following equation:

$$Z_{trans,transformer} = \frac{z_0 + jz_{trnasformer}\tan(\beta_{transformer}d_{transformer})}{z_{transformer} + jz_0\tan(\beta_{transformer}d_{transformer})},$$

wherein j is the imaginary number.

15. The method according to claim 1,
wherein the at least one sample parameter of electromagnetic relevance comprises the permittivity of the transformer material $\varepsilon_{transformer}$,
wherein the method further comprises the step of calculating the impedance of the transformer material $Z_{transformer}$ with the aid of the following equation:

$$Z_{transformer} = \frac{z_0}{\sqrt{\varepsilon_{transformer}}},$$

wherein $Z_0$ is the impedance of free space.

16. The method according to claim 1,
wherein the at least one measurement parameter of electromagnetic relevance comprises with respect to the surface of the sample arrangement, a measured reflection coefficient $r_m$,
wherein the method further comprises the step of calculating the corresponding impedance $Z_m$ by solving the following equation for $Z_m$:

$$r_m = \frac{z_m - z_0}{z_m + z_n},$$

wherein $Z_0$ is the impedance of free space.

17. The method according to claim 16,
wherein the method further comprises the step of calculating the permittivity of the surface $\varepsilon_{surface}$ by solving the following equation for $\varepsilon_{surface}$:

$$Z_m = \frac{z_{trans,transformer} + j\frac{z_0}{\sqrt{\varepsilon_{surface}}}\tan\left(\frac{2\pi}{\lambda}d_{surface}\sqrt{\varepsilon_{surface}}\right)}{\frac{z_0}{\sqrt{\varepsilon_{surface}}} + jz_{trans,transformer}\tan\left(\frac{2\pi}{\lambda}d_{surface}\sqrt{\varepsilon_{surface}}\right)},$$

wherein j is the imaginary number,
wherein $Z_0$ is the impedance of free space,
wherein $\lambda$ is the wavelength of the electromagnetic excitation signal,
wherein $d_{surface}$ is the thickness of the surface, and
wherein $Z_{trans,transformer}$ is the transformed free space impedance over the transformer material being defined as $$Z_{trans,transformer} = \frac{z_0 + jz_{transformer}\tan(\beta_{transformer}d_{transformer})}{z_{transformer} + jz_0\tan(\beta_{transformer}d_{transformer})},$$

wherein $Z_{transformer}$ is the impedance of the transformer material being defined as $$Z_{transformer} = \frac{z_0}{\sqrt{\varepsilon_{transformer}}},$$

wherein $\varepsilon_{transformer}$ is the permittivity of the transformer material, wherein $\beta_{transformer}$ is the phase constant of the transformer material being defined as $$\beta_{transformer} = \frac{2\pi}{\lambda}\sqrt{\varepsilon_{transformer}},$$

and wherein $d_{transformer}$ is the thickness of the transformer material.

18. The method according to claim 1,
wherein a tolerance analysis of the varied contribution of the at least one sample parameter is made at the same time and/or
wherein around an area of an optimum frequency matching a degradation depending on the changes of the varied contribution of the at least one sample parameter is observed.

19. A system for determining optimum parameters with respect to transmission and/or reflection of a surface, the system comprising:
an applicator configured to apply the surface to a transformer material in order to form a sample arrangement, and
a measurement equipment configured to obtain at least one measurement parameter of electromagnetic relevance with respect to the surface of the sample arrangement with an electromagnetic excitation signal,
wherein the transformer material comprises at least two dimensions for varying a contribution of at least one sample parameter of electromagnetic relevance over the surface.

\* \* \* \* \*